United States Patent
Chen et al.

(10) Patent No.: US 9,913,398 B1
(45) Date of Patent: Mar. 6, 2018

(54) CABLE MANAGEMENT ASSEMBLY AND CABLE MANAGEMENT DEVICE THEREOF

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/361,069

(22) Filed: Nov. 24, 2016

(30) Foreign Application Priority Data

Aug. 12, 2016 (TW) .............................. 105126011 A

(51) Int. Cl.
| | |
|---|---|
| *F16L 3/00* | (2006.01) |
| *H05K 7/14* | (2006.01) |
| *H05K 7/18* | (2006.01) |
| *F16L 3/26* | (2006.01) |
| *F16L 3/015* | (2006.01) |

(52) U.S. Cl.
CPC ............ *H05K 7/1491* (2013.01); *F16L 3/015* (2013.01); *F16L 3/26* (2013.01); *H05K 7/18* (2013.01); *H05K 7/183* (2013.01)

(58) Field of Classification Search
CPC ... F16L 3/015; F16L 3/26; H05K 7/18; H05K 7/1491; H05K 7/183
USPC ......... 248/49, 74.2; 211/26, 175; 312/223.2; 361/679.01, 679.1
See application file for complete search history.

(56) References Cited

U.S. PATENT DOCUMENTS

| | | | |
|---|---|---|---|
| 4,609,171 A | * | 9/1986 | Matsui ...................... F16L 3/12 24/16 PB |
| 7,554,819 B2 | | 6/2009 | Chen |
| 8,157,222 B1 | | 4/2012 | Shirey |
| 8,634,198 B2 | | 1/2014 | Chen |
| 9,072,190 B2 | | 6/2015 | Chen |
| 9,402,329 B1 | | 7/2016 | Chen |
| 2005/0115739 A1 | | 6/2005 | Brockman |
| 2006/0113433 A1 | | 6/2006 | Chen |

(Continued)

FOREIGN PATENT DOCUMENTS

| | | |
|---|---|---|
| FR | 2 383 539 A1 | 10/1978 |
| JP | H09144718 A | 6/1997 |

(Continued)

*Primary Examiner* — Gwendolyn W Baxter
(74) *Attorney, Agent, or Firm* — Winston Hsu

(57) ABSTRACT

A cable management device is applicable to a cable management assembly. The cable management device includes a first component and a second component. The first component includes a wall. A cable management space is defined by the first component and the second component. The second component is configured to be opened or closed relative to the first component. The second component includes two portions. When the second component is closed relative to the first component, the wall of the first component is engaged between the two portions of the second component.

9 Claims, 7 Drawing Sheets

(56) References Cited

U.S. PATENT DOCUMENTS

| | | | | |
|---|---|---|---|---|
| 2010/0039007 | A1* | 2/2010 | Fan | H05K 7/1491 312/223.2 |
| 2011/0186532 | A1* | 8/2011 | Wu | H05K 7/18 211/26 |
| 2015/0342081 | A1* | 11/2015 | Chang | H05K 7/1491 361/679.02 |
| 2016/0161026 | A1* | 6/2016 | Chen | F16L 3/015 248/70 |

FOREIGN PATENT DOCUMENTS

| | | | |
|---|---|---|---|
| JP | 2583435 | Y2 | 10/1998 |
| JP | 3200948 | U | 11/2015 |

\* cited by examiner

CABLE MANAGEMENT ASSEMBLY AND CABLE MANAGEMENT DEVICE THEREOF

BACKGROUND OF THE INVENTION

1. Field of the Invention

The present invention relates to a cable management assembly, and more particularly, to a cable management assembly applicable to a rack system and a cable management device thereof.

2. Description of the Prior Art

Generally, a cable management assembly is usually used in a rack system. In particular, the rack system comprises a pair of slide rail assemblies mounted to a plurality of posts of a rack. A rail of the slide rail assembly is configured to carry an electronic apparatus, such as a server. The cable management assembly is configured to hold or accommodate cables of the electronic apparatus, in order to allow the cables to remain organized when the electronic apparatus is moved relative to the rack through the rail.

U.S. Pat. No. 7,554,819 B2 discloses a cable management arm assembly. FIG. 1 of the case shows the cable management arm assembly comprising a front arm (11) and a rear arm (12) pivoted relative to the front arm (11). As shown in FIG. 14 and FIG. 15 of the case, an end of the rear arm (12) is mounted to an outer rail (A) of a slide rail assembly, and an end of the front arm (11) is mounted to an inner rail (C) of the slide rail assembly, such that the front arm (11) and the rear arm (12) can be retracted or expanded in response to movement of the inner rail (C) relative to the outer rail (A). Wherein, a plurality of cable holders (15) are arranged on each of the arms (11, 12) of the slide rail assembly for holding or accommodating the cables. The case is provided for reference.

FIG. 1 is a diagram showing a cable holder of the prior art. Specifically, the cable holder comprises a cable base 100 and a cover 102. The cable base 100 has a wall 105, and the wall 105 has a first engagement part 106. On the other hand, the cover 102 has a second engagement part 104. When the cover 102 is in a closed state relative to the cable base 100, the second engagement part 104 is engaged with the first engagement part 106. However, as shown in FIG. 2, in the closed state, when a force F is applied to the wall 105 of the cable base 100 inwardly, the first engagement part 106 may be detached from the second engagement 104. Accordingly, as shown in FIG. 3, the cover 102 can be freely opened relative to the cable base 100 along a direction D.

Therefore, for different operating conditions and different market requirements, it is necessary to develop different products to meet specific requirements.

SUMMARY OF THE INVENTION

The present invention relates to a cable management assembly and a cable management device thereof. Wherein, the cable management device of the cable management assembly is configured to accommodate or hold cables.

According to an embodiment of the present invention, a cable management device comprises a first component and a second component. The first component comprises a bottom part and a wall bent relative to the bottom part. The second component is configured to be opened or closed relative to the first component. The second component comprises two portions corresponding to the wall and extended toward the bottom part. Wherein, when the second component is closed relative to the first component, a cable management space is defined by the first component and the second component, and the wall of the first component is engaged between the two portions of the second component.

Preferably, the wall of the first component has a first side and a second side. The first side is formed with a first engagement part. The two portions of the second component are a second engagement part and an auxiliary part respectively. When the second component is closed relative to the first component, the second engagement part is engaged with the first engagement part of the first component and the auxiliary part is located adjacent to the second side of the wall of the first component.

Preferably, the second side of the wall of the first component is opposite to the first side.

Preferably, the second component is pivoted relative to the first component.

Preferably, the auxiliary part comprises a first guiding section. During a process of closing the second component relative to the first component, the first guiding section contacts the wall of the first component.

Preferably, the first guiding section has an inclined surface or a curved surface.

Preferably, one of the first component and the second component has a second guiding section for guiding the second engagement part of the second component to be engaged with the first engagement part of the first component during the process of closing the second component relative to the first component. The second guiding section has an inclined surface or a curved surface.

According to another embodiment of the present invention, a cable management assembly comprises an arm and a cable management device. The cable management device is arranged on the arm. The cable management device comprises a first component and a second component. The first component comprises a wall. The wall has a first side and a second side. The first side is formed with a first engagement part. The second component is configured to be opened or closed relative to the first component. The second component comprises a second engagement part and an auxiliary part. When the second component is closed relative to the first component, the second engagement part is engaged with the first engagement part of the first component, and the auxiliary part is located adjacent to the second side of the wall of the first component According to another embodiment of the present invention, a cable management assembly is applicable to a rack system. The rack system comprises a pair of slide rail assemblies for mounting a carried object to a rack. Each of the slide rail assemblies comprises a first rail and a second rail movable relative to the first rail. The first rail is configured to be mounted to a pair of posts of the rack. The second rail is configured to carry the carried object. The cable management assembly comprises two arms and a plurality of cable management devices. The two arms are pivoted to each other. The plurality of cable management devices are arranged on the two arms. Each of the cable management devices comprises a first component and a second component. The first component comprises a bottom part and a wall bent relative to the bottom part. The second component is configured to be opened or closed relative to the first component. The second component comprises two portions corresponding to the wall and extended toward the bottom part. When the second component is closed relative to the first component, the wall of the first component is engaged between the two portions of the second component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
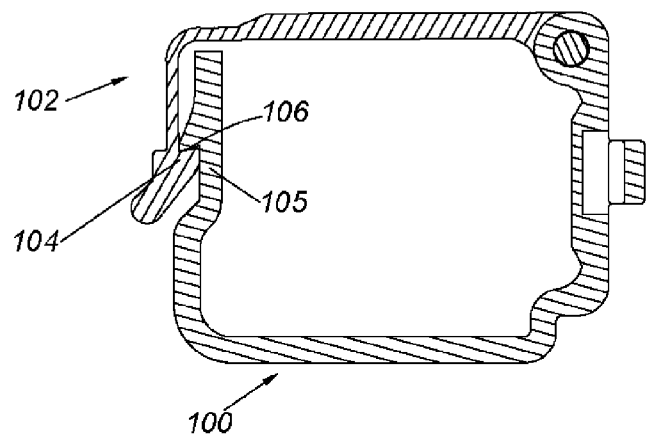
FIG. 1 is a diagram showing a cable holder of the prior art, wherein a cover of the cable holder is engaged with a cable base, and the cover is in a closed state relative to the cable base.
Figure 2:
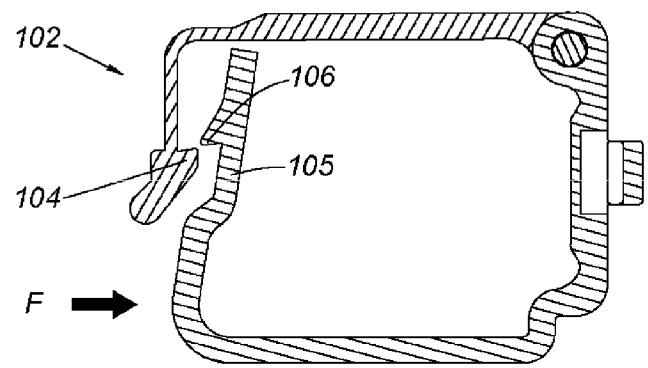
FIG. 2 is a diagram showing a wall of the cable base of the cable holder of the prior art being pushed by a force, and the cover being disengaged from the cable base.
Figure 3:
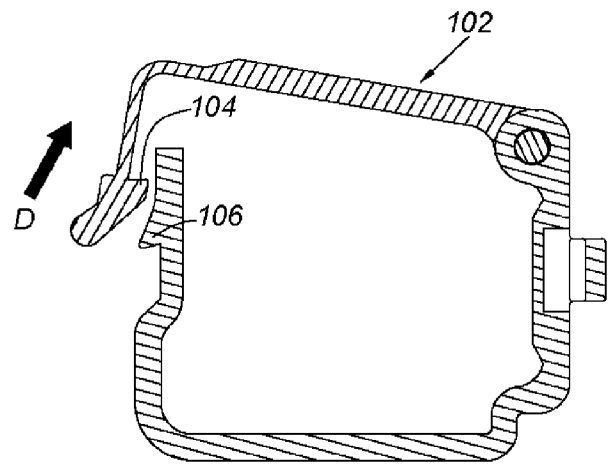
FIG. 3 is a diagram showing the cover being opened relative to the cable base after the cover is disengaged from the cable base.
Figure 4:
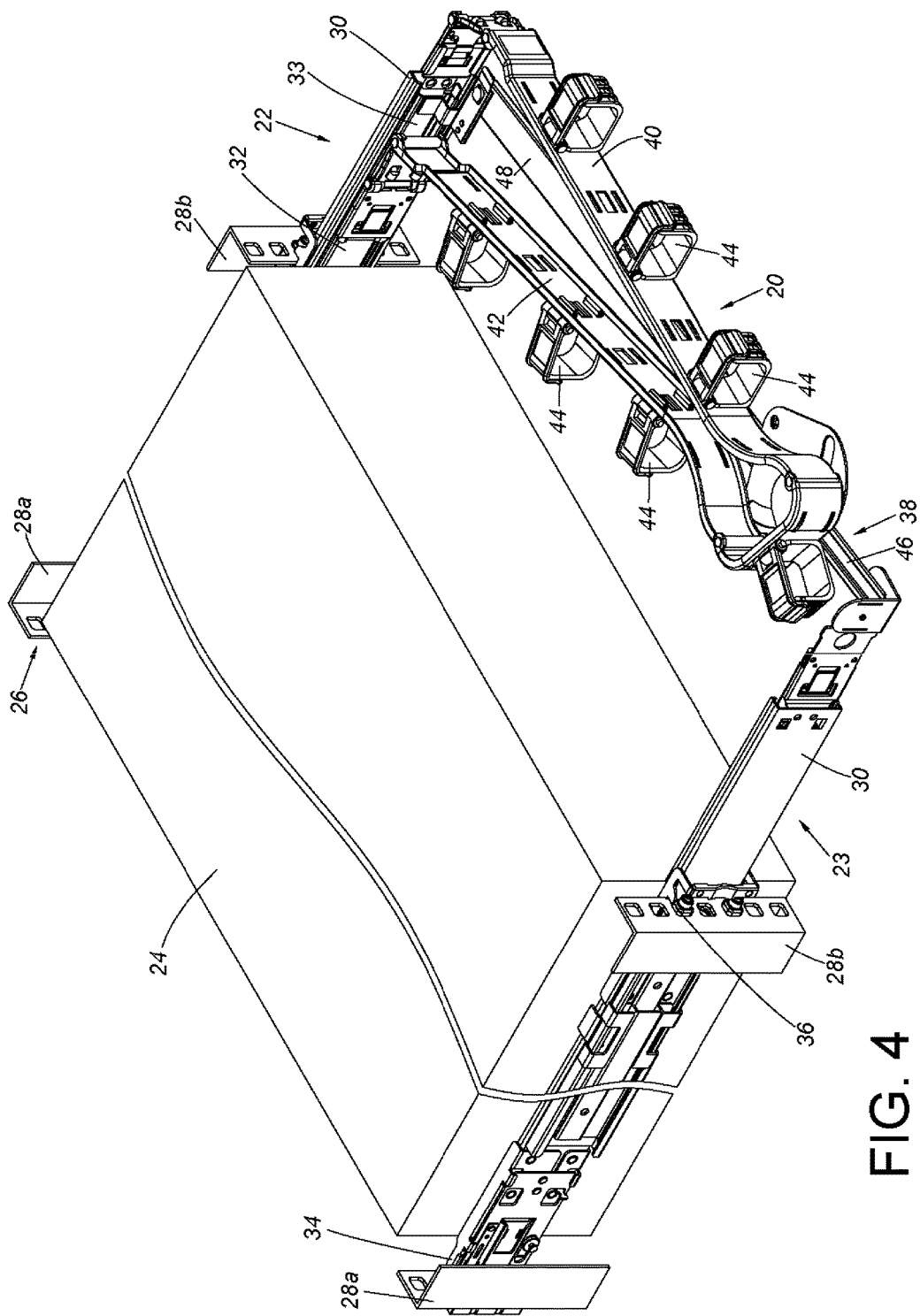
FIG. 4 is a diagram showing a cable management assembly applied to a rack system according to an embodiment of the present invention.

FIG. 4 is a diagram showing a cable management assembly 20 applied to a rack system according to an embodiment of the present invention. The rack system comprises a first slide rail assembly 22 and a second slide rail assembly 23. The pair of slide rail assemblies 22, 23 is configured to mount a carried object 24 to a rack 26. Wherein, the rack 26 comprises a pair of first posts 28a and a pair of second posts 28b. Each of the slide rail assemblies 22, 23 comprises a first rail 30 and a second rail 32 movable relative to the first rail 30. Preferably, each of the slide rail assemblies 22, 23 further comprises a third rail 33 movably mounted between the first rail 30 and the second rail 32 for extending a travelling distance of the second rail 32 relative to the first rail 30. In particular, the first rail 30 can be mounted to the first post 28a and the second post 28b through a first bracket 34 and a second bracket 36 respectively. On the other hand, the second rail 32 is configured to carry the carried object 24. In the present embodiment, the carried object 24 is an electronic apparatus. Preferably, the cable management assembly 20 further comprises a supporting device 38.

Figure 5:
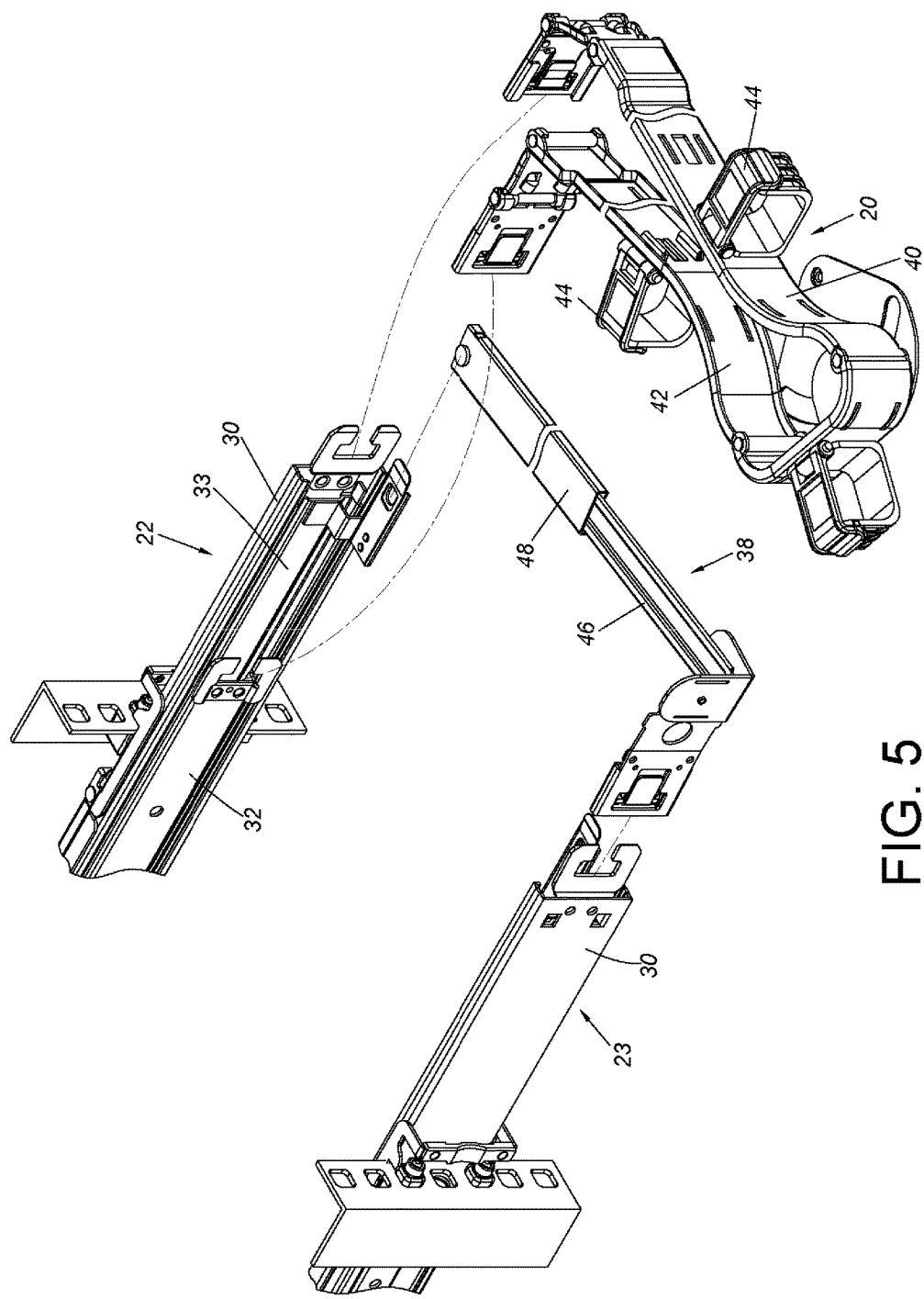
FIG. 5 is an exploded view of the cable management assembly and a slide rail assembly according to an embodiment of the present invention.

As shown in FIG. 5, the cable management assembly 20 comprises at least one arm and at least one cable management device. In the present embodiment, the cable management assembly 20 comprises a first arm 40, a second arm 42 and a plurality of cable management devices 44 connected to the first arm 40 and the second arm 42. In particular, the first arm 40 the second arm 42 are pivoted relative to each other. An end of the first arm 40 is connected to the first rail 30 of the first slide rail assembly 22, and an end of the second arm 42 is connected to the second rail 32 of the first slide rail assembly 22. On the other hand, the supporting device 38 is mounted between the first slide rail assembly 22 (such as the third rail 33 of the first slide rail assembly 22) and the second slide rail assembly 23 (such as the first rail 30 of the second slide rail assembly 23). The supporting device 38 is configured to support the cable management assembly 20. The supporting device 38 comprises a first supporting member 46 and a second supporting member 48 movable relative to the first supporting member 46. For example, the second supporting member 48 is telescopically connected to the first supporting member 46.

Figure 6:
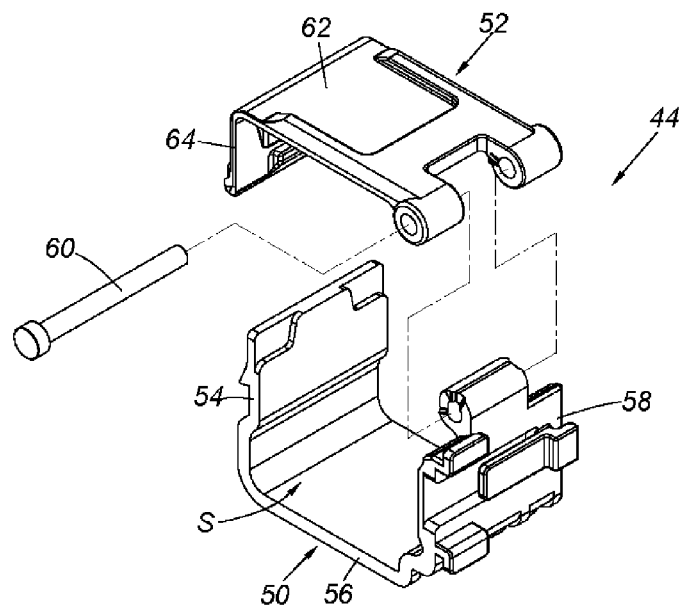
FIG. 6 is an exploded view of a cable management device according to an embodiment of the present invention.
Figure 7:
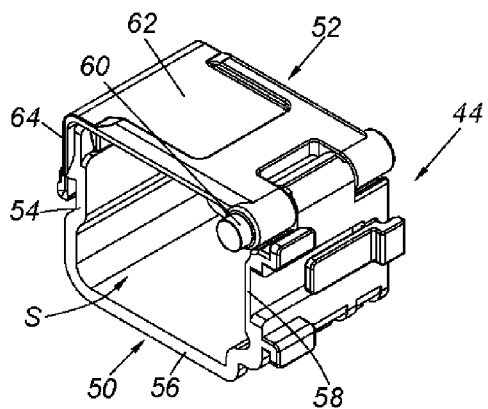
FIG. 7 is a diagram showing the cable management device according to an embodiment of the present invention.

As shown in FIG. 6 and FIG. 7, each of the cable management devices 44 comprises a first component 50 and a second component 52. Preferably, the first component 50 and the second component 52 are made of a flexible material, such as a plastic or metal material. In the present embodiment, the first component 50 is a base and the second component 52 is a cover. The second component 52 can be opened or closed relative to the first component 50. When the second component 52 is closed relative to the first component 50, a cable management space S is defined by the first component 50 and the second component 52. The cable management space S is configured to accommodate cables (not shown in figures) of the carried object 24. The function of the cable management device is well known to those skilled in the art. Therefore, no further illustration is provided.

The first component 50 comprises a wall 54. In the present embodiment, the first component 50 further comprises a bottom part 56 and a connection part 58. Each of the wall 54 and the connection part 58 is bent relative to the bottom part 56 to from a predetermined angle therebetween. In particular, the wall 54, the bottom part 56 and the connection part 58 can form a U-shaped structure. The shape the first component 50 is illustrated as an example, the present invention is not limited thereto. Each of the cable management devices 44 is connected (such as engaged) with the first arm 40 or the second arm 42 through a plurality of engaging features arranged on the connection part 58 of the first component 50.

The second component 52 is pivoted relative to the first component 50. For example, the second component 52 is pivoted to the connection part 58 of the first component 50 by a shaft 60.

Figure 8:
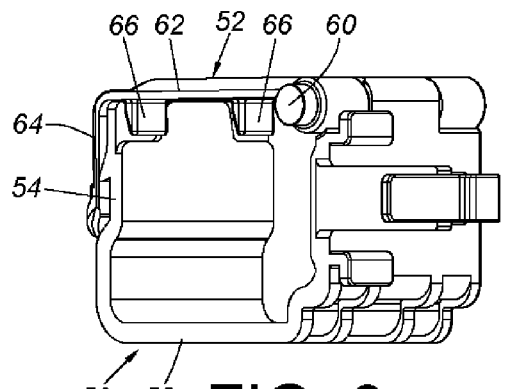
FIG. 8 is a diagram showing the cable management device of FIG. 7 in another angle.

As shown in FIG. 8, the second component 52 comprises a first part 62 and a second part 64. Preferably, the second part 64 is bent relative to the first part 62 and extended toward the bottom part 56. Wherein, the second component 52 further comprises at least one auxiliary part 66. In the present embodiment, the second component 52 further comprises two auxiliary parts 66 arranged on the first part 62. Wherein, the two auxiliary parts 66 are protruded from the first part 62 and extended toward the bottom part 56. A protrusion direction of the two auxiliary parts 66 relative to the first part 62 is substantially identical to a bending direction of the second part 64 relative to the first part 62.

Figure 9:
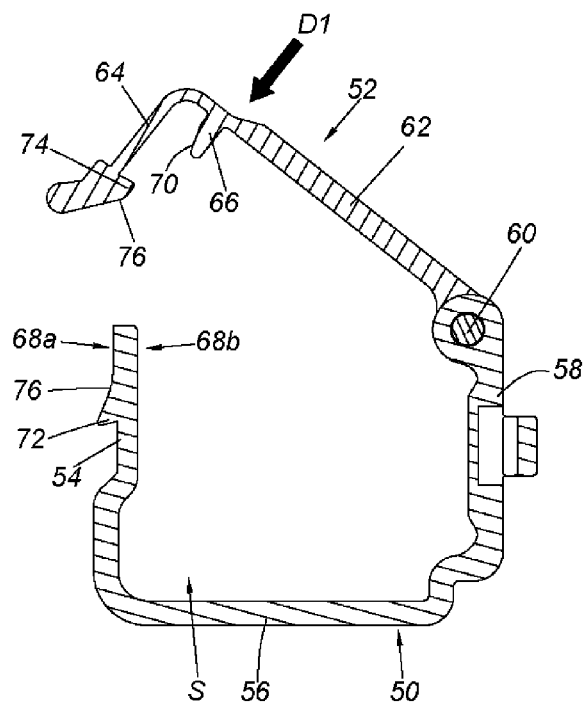
FIG. 9 is a diagram showing the cable management device in an opened state according to an embodiment of the present invention.

As shown in FIG. 9, the wall 54 of the first component 50 of the cable management device 44 has a first side 68a and a second side 68b. Preferably, the second side 68b is opposite to the first side 68a. Preferably, the auxiliary part 66 comprises a first guiding section 70. The first guiding section 70 has an inclined surface or a curved surface. On the other hand, the first side 68a of the wall 54 of the first component 50 is formed with a first engagement part 72. The second component 52 comprises a second engagement part 74. The second engagement part 74 is arranged on the second part 64 of the second component 74. Preferably, at least one of the first component 50 and the second component 52 has a second guiding section 76. In the present embodiment, each of the first engagement part 72 of the first component 50 and the second engagement part 74 of the second component 52 has the second guiding section 76. Wherein, the second guiding section 76 has an inclined surface or a curved surface.

Figure 10:
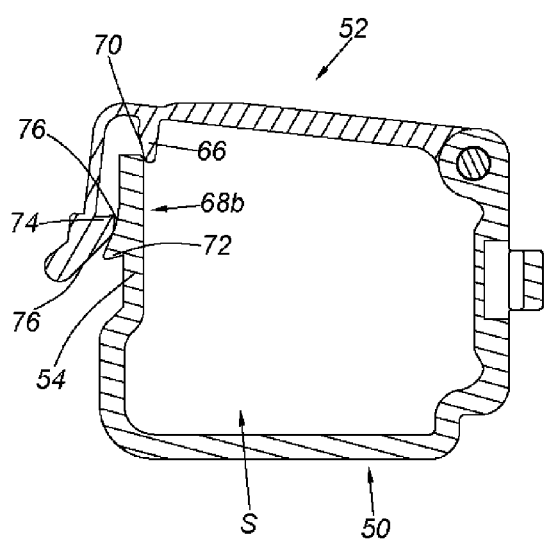
FIG. 10 is a diagram showing the cable management device of FIG. 9 being gradually closed from the opened state.
Figure 11:
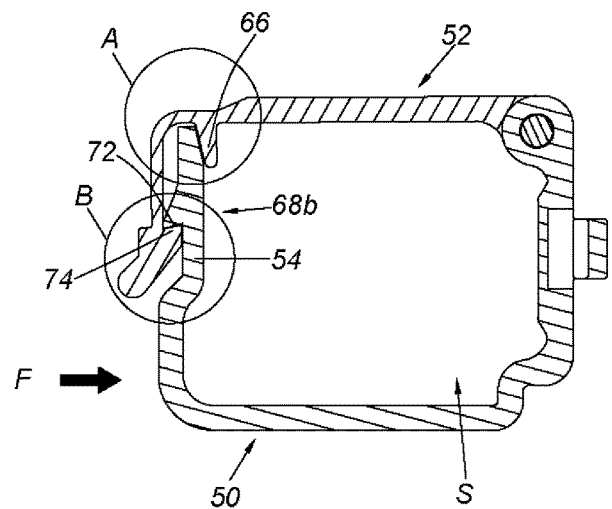
FIG. 11 is a diagram showing the cable management device of FIG. 10 being in a closed state.

As shown in FIG. 9 to FIG. 11, during a process of closing the second component 52 relative to the first component 50 along a first direction D1, the second engagement part 74 of the second component 52 is guided by the two second guiding sections 76 to be engaged with the first engagement part 72 of the first component 50. On the other hand, the first guiding section 70 of the auxiliary part 66 of the second component 52 contacts the second side 68b of the wall 54 of the first component 50 such that the first guiding section 70 can provide a guiding effect during the process of closing the second component 52 relative to the first component 50.

As shown in FIG. 11, when the second component 52 is in a closed state relative to the first component 50, the second engagement part 74 of the second component 52 is engaged with the first engagement part 72 of the first component 50, and the auxiliary part 66 is located adjacent and corresponding to the second side 68b of the wall 54 of the first component 50. Specifically, in the closed state, the wall 54 of the first component 50 is engaged between two portions (such as the second engagement part 74 and the auxiliary part 66) of the second component 52. In other words, arrangement of the auxiliary part 64 of the second component 52 can prevent the first engagement part 72 and the second engagement part 74 from being freely (or unintentionally) disengaged from each other due to the wall 54 of the first component 50 being pressed by a force F inwardly.

Figure 12:
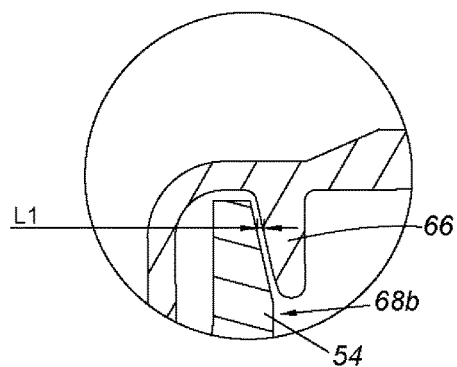
FIG. 12 is an enlarged view of an area A of FIG. 11.
Figure 13:
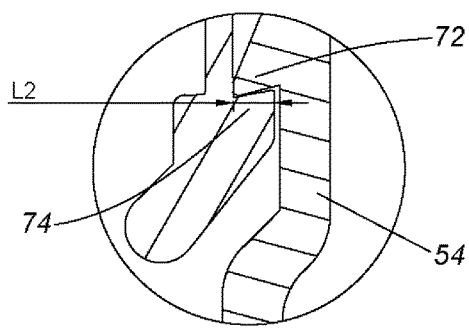
FIG. 13 is an enlarged view of an area B of FIG. 11.

As shown in FIG. 12 and FIG. 13, when the second component 52 is in the closed state relative to the first component 50, a first distance L1 is defined between the auxiliary part 66 and the second side 68b of the wall 54 of the first component 50. On the other hand, a second distance L2 (such as an engagement distance) is defined between a front end of the first engagement part 72 and a front end the second engagement part 74. Wherein, the first distance L1 is smaller than the second distance L2. That is to say, when the wall 54 of the first component 50 is pressed by the force F inwardly, the wall can be flexibly bent inwardly only within the first distance L1 due to blocking of the auxiliary part 66, such that a movable distance of the first engagement part 72 relative to the second engagement part 74 is smaller than the second distance L2. Therefore, the first engagement part 72 can be prevented from being disengaged from the second engagement part 74.

Figure 14:
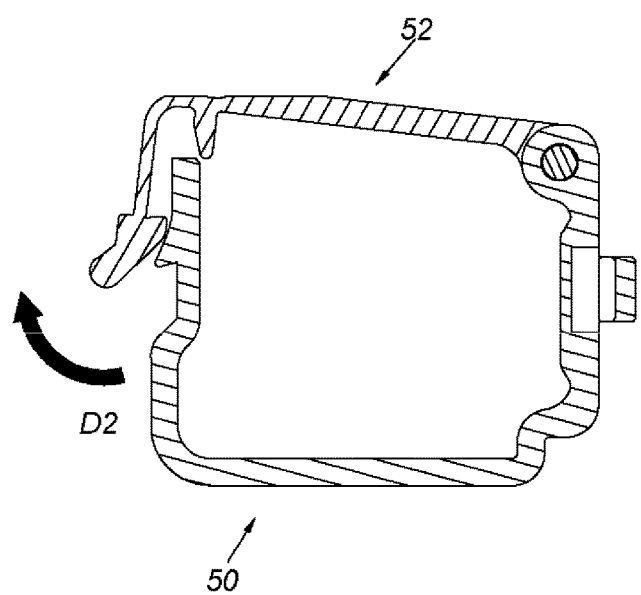
FIG. 14 is a diagram showing the cable management device being gradually opened form the closed state according to an embodiment of the present invention.

As shown in FIG. 14, in order to disengage the second component part 74 from the first engagement part 72, a user can open the second component 52 relative to the first component 50 along a second direction D2, so as to allow the second component 52 to be in an opened state relative to the first component 50 (refer to FIG. 9) for mounting or moving out the cables of the carried object 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management device, comprising:
   a first component comprising a bottom part and a wall bent relative to the bottom part, wherein the wall of the first component has a first side and a second side, the first side is formed with a first engagement part, the second side is formed with a protrusion; and
   a second component configured to be opened or closed relative to the first component, the second component comprising a second engagement part and two auxiliary parts corresponding to the wall and extended toward the bottom part;
   wherein when the second component is closed relative to the first component, a cable management space is defined by the first component and the second component, and the wall of the first component is engaged between the second engagement part and the two auxiliary parts of the second component;
   wherein when the second component is closed relative to the first component, the second engagement part is engaged with the first engagement part of the first component, front sides of the two auxiliary part are located adjacent to the second side of the wall of the first component, the protrusion is located between lateral sides of the two auxiliary parts to block the second component from moving along two opposite directions parallel to a rotational axis of the second component.

2. The cable management device of claim 1, wherein the second side of the wall of the first component is opposite to the first side.

3. The cable management device of claim 1, wherein the second component is pivoted relative to the first component.

4. The cable management device of claim 1, wherein the auxiliary part comprises a first guiding section, during a process of closing the second component relative to the first component, the first guiding section contacts the wall of the first component.

5. The cable management device of claim 4, wherein the first guiding section has an inclined surface or a curved surface.

6. The cable management device of claim 1, wherein one of the first component and the second component has a second guiding section for guiding the second engagement part of the second component to be engaged with the first engagement part of the first component during the process of closing the second component relative to the first component, the second guiding section has an inclined surface or a curved surface.

7. A cable management assembly, comprising:
   an arm; and
   a cable management device arranged on the arm, the cable management device comprising:
   a first component comprising a wall, the wall having a first side and a second side, the first side being formed with a first engagement part, the second side being formed with a protrusion; and
   a second component configured to be opened or closed relative to the first component, the second component comprising a second engagement part and two auxiliary parts, wherein when the second component is closed relative to the first component, the second engagement part is engaged with the first engagement part of the first component, and front sides of the two auxiliary parts are located adjacent to the second side of the wall of the first component, the protrusion is located between lateral sides of the two auxiliary parts to block the second component from moving along two opposite directions parallel to a rotational axis of the second component.

8. The cable management assembly of claim 7, wherein the second side of the wall of the first component is opposite to the first side.

9. A cable management assembly, applicable to a rack system, the rack system comprising a pair of slide rail assemblies for mounting a carried object to a rack, each of the slide rail assemblies comprising a first rail and a second rail movable relative to the first rail, the first rail being configured to be mounted to a pair of posts of the rack, the second rail being configured to carry the carried object, the cable management assembly comprising:

two arms pivoted to each other; and a plurality of cable management devices arranged on the two arms, each of the cable management devices comprising:

a first component comprising a bottom part and a wall bent relative to the bottom part, wherein the wall of the first component has a first side and a second side, the first side is formed with a first engagement part, the second side is formed with a protrusion; and a second component configured to be opened or closed relative to the first component, the second component comprising a second engagement part and two auxiliary parts corresponding to the wall and extended toward the bottom part, wherein when the second component is closed relative to the first component, the wall of the first component is engaged between the second engagement part and the two auxiliary parts of the second component;

wherein when the second component is closed relative to the first component, the second engagement part is engaged with the first engagement part of the first component, front sides of the two auxiliary parts are located adjacent to the second side of the wall of the first component, the protrusion is located between lateral sides of the two auxiliary parts to block the second component from moving along two opposite directions parallel to a rotational axis of the second component.

* * * * *